US006936853B2

(12) United States Patent
Wirth

(10) Patent No.: US 6,936,853 B2
(45) Date of Patent: Aug. 30, 2005

(54) LIGHT-EMITTING SEMICONDUCTOR COMPONENT

(75) Inventor: Ralph Wirth, Pettendorf-Adlersberg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 32 days.

(21) Appl. No.: 10/448,952

(22) Filed: May 30, 2003

(65) Prior Publication Data

US 2004/0007707 A1 Jan. 15, 2004

(30) Foreign Application Priority Data

May 31, 2002 (DE) ........................................ 102 24 219

(51) Int. Cl.[7] ................................................ H01L 29/72
(52) U.S. Cl. .............................. 257/79; 257/80; 257/81
(58) Field of Search .............................. 257/79, 80, 81

(56) References Cited

U.S. PATENT DOCUMENTS 3,739,217 A 6/1973 Bergh et al.
6,111,272 A 8/2000 Heinen
6,440,765 B1 * 8/2002 Sedlmeier et al. ............ 438/47

FOREIGN PATENT DOCUMENTS

| | | | |
|---|---|---|---|
| DE | 2 030 974 | | 6/1970 |
| DE | 199 47 030 | A1 | 9/1999 |
| EP | 0 905 797 | A2 | 8/1998 |
| EP | 0 977 280 | A2 | 7/1999 |
| JP | 07038146 | A | 2/1995 |
| JP | 07038146 | * | 2/1995 |
| WO | WO 01/24280 | A1 | 4/2001 |

OTHER PUBLICATIONS

I. Schnitzer et al., "30% external quantum efficiency from surface textured, thin–film light–emitting diodes", Appl. Phys. Lett. 63 (16), pp. 2174–2176, Oct. 1993.

* cited by examiner

*Primary Examiner*—Edward Wojciechowicz
(74) *Attorney, Agent, or Firm*—Cohen, Pontani, Lieberman & Pavane

(57) ABSTRACT

In a light-emitting semiconductor component having a thin-film stack (30) having an active layer (34) and front- and rear-side contact regions (40, 42), which are formed on a front side (60) and a rear side (62) of the thin-film stack (30) and serve for impressing current into the active layer (34), the thin-film stack (30) has a light generation region (50), in which photons are generated by recombination of charge carriers, and has a light coupling-out region (54), in which light is coupled out from the component. The light generation region (50) and the light coupling-out region (54) are at least partly separated from one another in the plane of the thin-film stack (30).

29 Claims, 3 Drawing Sheets

LIGHT-EMITTING SEMICONDUCTOR COMPONENT

FIELD OF THE INVENTION

The invention relates to a light-emitting semiconductor component having a thin-film stack having an active layer and front- and rear-side contact regions, which are formed on a front side and a rear side of the thin-film stack and serve for impressing current into the active layer.

This patent application claims the priority of German patent application 10224219.4-33, the disclosure content of which is hereby incorporated by reference.

BACKGROUND OF THE INVENTION

A conventional thin-film light-emitting diode is shown and described for example in the European patent application EP-A-0 905 797. The thin-film principle utilized in this case is based on internal multiple reflections, connected with an internal scattering of the light beams. In this case, the designation "thin" relates to the optical thickness of the light-emitting diode, that is to say is to be understood in the sense of "optically thin". Between two scattering reflections, the absorption incurred by a light beam is intended to be as low as possible.

A thin-film light-emitting diode chip is distinguished in particular by the following characteristic features:

- a reflective layer is applied or formed at a first main area—facing toward a carrier element—of a radiation-generating epitaxial layer sequence, which reflective layer reflects at least part of the electromagnetic radiation generated in the epitaxial layer sequence back into the latter;
- the epitaxial layer sequence has a thickness in the region of 20 $\mu$m or less, in particular in the region of 10 $\mu$m; and
- the epitaxial layer sequence contains at least one semiconductor layer having at least one area which has an intermixing structure which ideally leads to an approximately ergodic distribution of the light in the epitaxial layer sequence, i.e. it has an as far as possible ergodically stochastic scattering behavior.

A basic principle of a thin-film light-emitting diode chip is described for example in I. Schnitzer et al., Appl. Phys. Lett. 63 (16), Oct. 18, 1993, 2174–2176, the disclosure content of which is in this respect hereby incorporated by reference.

The external efficiency of a thin-film light-emitting diode can be reduced in particular by the active layer of the light-emitting diode itself having a high absorption for the emitted radiation. This is the case for example with AlGaInP/GaAs-based light-emitting diodes in the yellow spectral region. It is often necessary, for reasons other than those associated with the thin-film principle, for instance in order to increase the internal efficiency, the temperature stability or the like, for the layer thickness of the active layer to be chosen to be sufficiently large. This results in that the active layer itself has an appreciable absorption. By way of example, in the case of a yellow AlGaInP/GaAs thin-film light-emitting diode, it may be necessary for the layer thickness to be chosen to be that large, that the absorption for passage of a light beam becomes greater than 10%.

On account of the comparatively low maximum barrier heights for electrons, the internal efficiency of a yellow-emitting active layer comprising the AlGaInP material system depends greatly on the charge carrier density in the active layer and thus on the layer thickness. FIG. 3 shows an empirical profile 70 of the internal efficiency $E_{int}$ of a yellow AlGaInP active layer as a function of the layer thickness d.

The coupling-out efficiency $E_{out}$ for such layers, that is to say the ratio of the number of coupled-out photons to the number of photons emitted in the semiconductor crystal, is illustrated in FIG. 4 likewise as a function of the thickness of the active layer d (curve 72). The values shown originate from a ray tracing simulation.

With these two quantities, the utilizable external efficiency $E_{ext}$ results from multiplication of the coupling-out efficiency and the internal efficiency, $$E_{ext}=E_{out}*E_{int}.$$

The resulting dependence of the external efficiency $E_{ext}$ on the layer thickness d is illustrated for a conventional yellow thin-film light-emitting diode in FIG. 5 by the curve 74. Since the internal efficiency $E_{int}$ rises sublinearly with the layer thickness, and the coupling-out efficiency $E_{out}$ falls approximately linearly with the layer thickness in the region of interest, the external efficiency $E_{ext}$ has a maximum which, in the example shown, lies at a thickness of the active layer of about 300 nm. The external efficiency $E_{ext}$ that can maximally be achieved at this layer thickness lies at a relatively low level of about 0.05. This approximately corresponds to what can likewise be achieved with a customary AlGaInP light-emitting diode, not operating according to the thin-film principle, in the yellow spectral region.

SUMMARY OF THE INVENTION

One object of the invention is to reduce the light absorption in generic light-emitting semiconductor components and thus increasing the external efficiency of the component.

This and other objects are attained in accordance with one aspect of the invention direted to a light-emitting semiconductor component having a thin-film stack having an active layer and front- and rear-side contact regions, which are formed on a front side and a rear side of the thin-film stack and serve for impressing current into the active layer. The thin-film stack has a light generation region, in which photons are generated by recombination of charge carriers, and has a light coupling-out region, in which light is coupled out from the component. The light generation region and the light coupling-out region are at least partly separated from one another in the plane of the thin-film stack.

According to an embodiment of the invention, in the case of a light-emitting semiconductor component of the type mentioned in the introduction, it is provided that the thin-film stack has a light generation region, in which photons are generated by recombination of charge carriers, and has a light coupling-out region, in which light is coupled out from the component, the light generation region and the light coupling-out region being at least partly separated from one another in the plane of the thin-film stack.

An aspect of the invention is thus based on the concept of canceling the rigid assignment of light generation and coupling-out of light so that a region is produced in which the generated light can be coupled out with high efficiency. Since restrictions imposed on conventional light-emitting diodes by the light generation requirements can remain largely disregarded in this region, an overall increased external efficiency can be achieved by means of the improved coupling-out.

In the light-emitting semiconductor component according to one aspect of the invention, it is advantageously provided that the light coupling-out region contains a region in which light is generated and also light is coupled out from the component.

In the light-emitting semiconductor component according to one aspect of the invention, it is preferably provided that the light coupling-out region contains a coupling-out only region without an active layer, in which no photons are generated by recombination of charge carriers. As a result, said coupling-out only region can be configured without the restrictions dictated by the light generation, in particular without the light absorption by the active layer.

In this connection, it may advantageously be provided that the surface of the coupling-out only region, which surface faces toward the front side of the thin-film stack, is roughened. The roughness leads to a scattering and thus to an efficient coupling-out of the light beams propagating in the coupling-out only region.

In this case, it may be expedient if the surface of the coupling-out only region, which surface faces toward the front side of the thin-film stack, has a roughness with an irregular structure.

In another configuration of the semiconductor component according to an aspect of the invention, it is preferred for the surface of the coupling-out only region, which surface faces toward the front side of thin-film stack, to have a regular structure, in particular a regular etching structure, as roughness. Both a regular structure and a "random" roughness with an irregular structure are referred to as roughness in the context of this invention. Both measures make it possible, by means of the light scattering, for the light generated in the active layer to be coupled out effectively.

Instead of or in addition to the roughness of that surface of the coupling-out only region which faces toward the front side of the thin-film stack, that surface of the coupling-out only region which faces toward the rear side of the thin-film stack can be roughened.

In the case of the rear-side roughness, too, it may be expedient if that surface of the coupling-out only region which faces toward the rear side of the thin-film stack has a roughness with an irregular structure. In another configuration of the invention, it is advantageously provided that that surface of the coupling-out only region which faces toward the rear side of the thin-film stack has a regular structure, in particular a regular etching structure, as roughness.

In a preferred development of the light-emitting semiconductor component according to an aspect of the invention, it is provided that the light generation region is spatially separated from the contact regions in the plane of the thin-film stack. The generated light can thus largely be kept away from the contact regions. Since the contact regions with their typical reflectivity of only about 30% substantially contribute to the radiation absorption of the radiation propagating in the thin-film stack, this further supports the intended purpose of reducing the overall absorption.

In particular, it may advantageously be provided that the light generation region is spatially separated from the contact regions by separating regions without an active layer.

For this purpose, the thin-film stack expediently has a first recess, interrupting the active layer, in a region around the front-side contact region.

As an alternative or in addition, the thin-film stack according to the invention may have a second recess, interrupting the active layer, in a region above the rear-side contact region.

In this connection, in a light-emitting semiconductor component having a coupling-out only region, it is preferred for the coupling-out only region to encompass the region of the second recess.

In the light-emitting semiconductor component, it may be provided according to the invention that the light generation region is electrically connected to the contact regions in each case by means of a cladding layer. This ensures the electrical contact for feeding current into the active layer.

In an expedient refinement of the invention, the cladding layer connecting the light generation region to the rear-side contact region forms the coupling-out only region in the region of the second recess.

In this case, the cladding layer connecting the light generation region to the rear-side contact region expediently has a layer thickness of about 1 $\mu$m to about 15 $\mu$m, preferably of about 2 $\mu$m to about 8 $\mu$m, particularly preferably of about 4 $\mu$m, in the region of the second recess.

The active layer of a light-emitting semiconductor component expediently has a layer thickness of 150 nm to 1500 nm, in particular of about 400 nm to about 1000 nm.

The front-side contact region of a light-emitting semiconductor component according to the invention is advantageously formed by a central middle contact.

The rear-side contact region is preferably formed by a contact frame enclosing the component.

In a preferred development of the component, the rear side of the thin-film stack, with the exception of the area of the rear-side contact region, is provided with a highly reflective mirror layer, in particular a dielectric mirror layer.

The thin-film stack itself expediently has a thickness of between and including 3 $\mu$m and 50 $\mu$m, preferably between and including 5 $\mu$m and 25 $\mu$m.

In one refinement of the light-emitting semiconductor component, the thin-film stack may have a layer sequence based on $Al_xGa_yIn_{1-x-y}P$, where $0 \leqq x \leqq 1$, $0 \leqq y \leqq 1$ and $x+y \leqq 1$. In this case, the cladding layers of the thin-film stack may be formed on the basis of $Al_xGa_{1-x}As$, where $0 \leqq x \leqq 1$. An active layer formed on the basis of $Al_xGa_yIn_{1-x-y}P$, where $0 \leqq x \leqq 1$, $0 \leqq y \leqq 1$ and $x+y \leqq 1$, may be arranged between the cladding layers.

The arrangement according to an aspect of the invention may likewise be employed for a thin-film stack having a layer sequence based on $Al_xGa_{1-x}As$, where $0 \leqq x \leqq 1$, for example a light-emitting diode which emits in the infrared spectral region.

Further advantageous refinements, features and details of the invention emerge from the dependent claims, the description of the exemplary embodiment and the drawings.

BRIEF DESCRIPTION OF THE DRAWINGS

The invention will be explained in more detail below using an exemplary embodiment in connection with the drawings. Only the elements essential for understanding the invention are illustrated in each case.

DETAILED DESCRIPTION OF THE DRAWINGS

Figure 1:
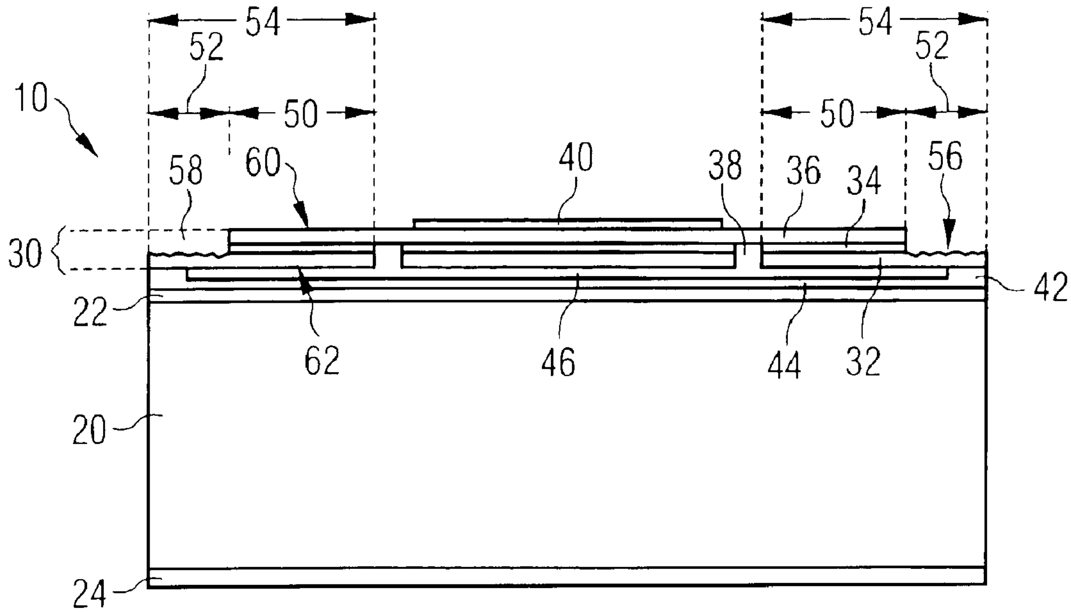
FIG. 1 shows a diagrammatic illustration of a sectional view of a light-emitting semiconductor component according to an exemplary embodiment of the invention.

FIG. 1 shows a diagrammatic illustration of a sectional view of a yellow AlGaInP-based thin-film light-emitting diode 10. The thin-film light-emitting diode 10 contains a thin-film stack 30, which is provided in a manner known per se on a conductive carrier substrate 20 provided with metal contacts 22, 24.

In the exemplary embodiment, the thin-film stack 30 has a p-doped first AlGaAs cladding layer 32, an active AlGaInP layer 34 and an n-doped second AlGaAs cladding layer 36. The conductivity types of the first and second cladding layers may also be interchanged.

In the exemplary embodiment, the region of the rear side 62 of the thin-film stack 30, with the exception of the contact regions 42 (described later), is coated with a highly reflective, non-alloyed mirror 46. The latter may comprise for example a dielectric such as SiN, $SiO_2$ or the like and a metalization such as Au, Ag, Al or the like.

A central mid-contact 40 is provided on the front side 60 of the second cladding layer 36. In the exemplary embodiment, the mid-contact 40 constitutes the n-type contact of the light-emitting diode and is formed from a conventional contact metal that is suitable for this purpose. Electrical contact is made with the p-type side via the metal layers 22 and 24 of the conductive carrier substrate 20, which are likewise formed from a conventional contact metal that is suitable for this purpose. The p-type contact layer of the thin-film stack 30 contains a continuous contact layer 44, which is electrically connected to the metal layer 22 provided on the top side of the carrier substrate 20. The contact layer 44 is likewise formed from a conventional contact metal that is suitable for this purpose.

Figure 2:
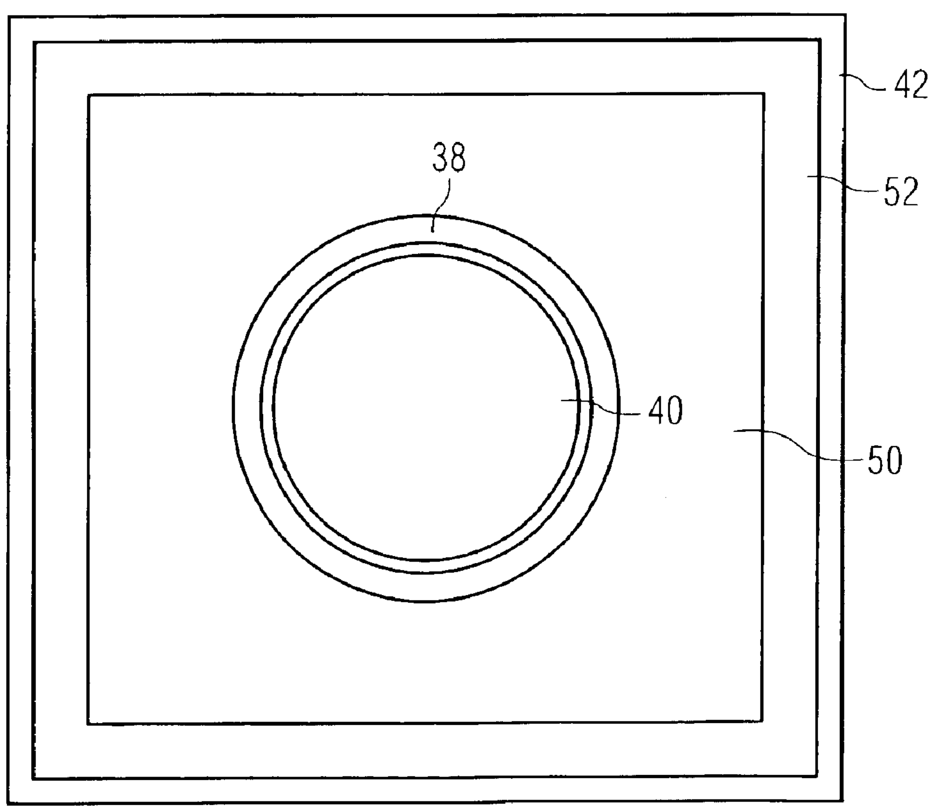
FIG. 2 shows a diagrammatic illustration of a plan view of the semiconductor component of FIG. 1.
Figure 3:
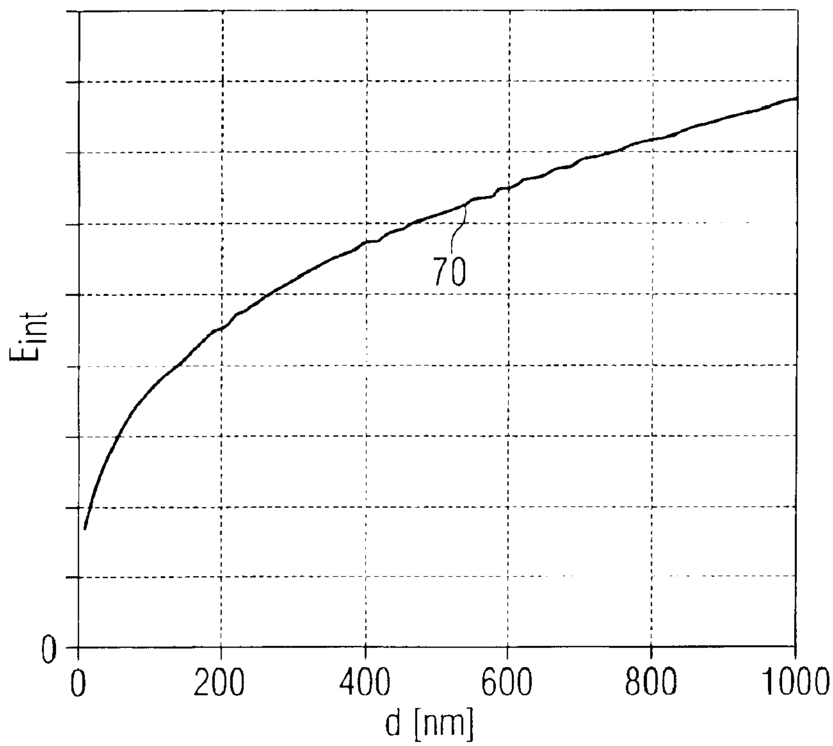
FIG. 3 shows an empirical profile of the internal efficiency $E_{int}$ of a conventional yellow AlGaInP active layer as a function of the layer thickness d.
Figure 4:
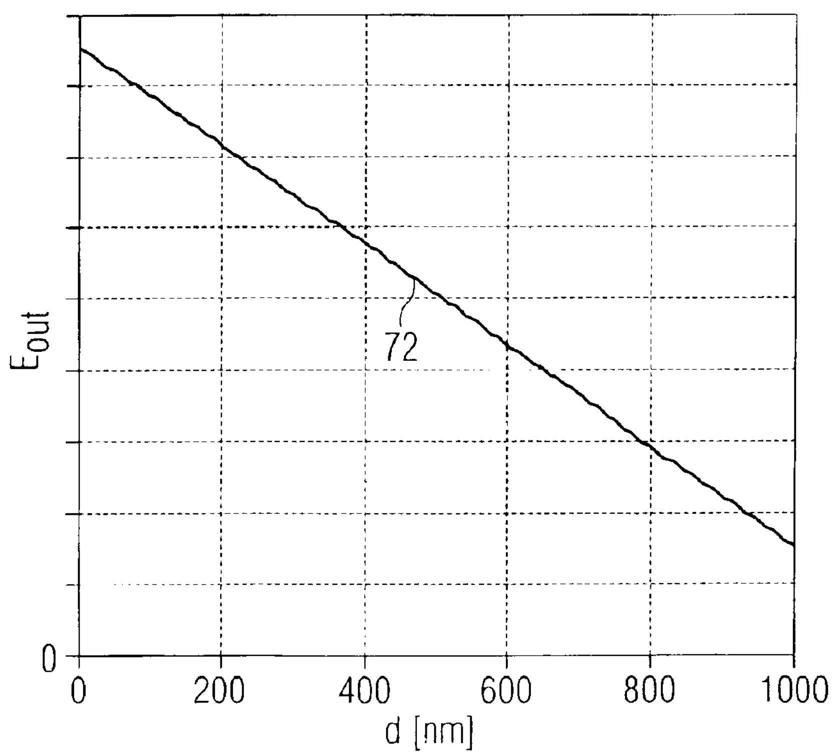
FIG. 4 shows the calculated profile of the coupling-out efficiency $E_{out}$ of a conventional yellow AlGaInP-based thin-film diode as a function of the thickness d of the active layer.

Current is fed into the active layer 34 not via the entire area of the contact layer 44, but rather only at a rear-side contact region 42. As can best be discerned in the illustration of FIG. 2, in the exemplary embodiment the rear-side contact region is formed by a peripheral contact frame 42 at the edge of the component.

In a region above the peripheral contact frame 42, the active layer 34 and the second cladding layer 36 are removed, for example by an etching process, as a result of which recesses 58 are formed in the thin-film stack 30.

In order to minimize a light absorption at the central front-side contact 40, an annular recess 38 is introduced into the thin-film stack 30 through removal of the active layer 34 and of the first cladding layer 32. The active layer 34 and the first cladding layer 32 may be removed for example by an etching process. By means of the two recesses 38 and 58, the light generation is restricted to a region 50, which is spatially separated from the contact regions 40 and 42. Undesirable light absorption at the contact regions 40 and 42 is thus largely avoided.

In the region of the recess 58, the first cladding layer 32 is thinned to a layer thickness of about 4 μm, for example, by the etching process. Furthermore, the surface 56 of the cladding layer 32, which surface faces toward the front side 60 of the thin-film stack 30, is roughened. Since the active layer has been removed in the region of the recess 58, the absorption there is very low and the coupling-out according to the thin-film principle is very effective, provided that a sufficient scattering of the light beams is ensured. In the exemplary embodiment, this scattering is produced by the roughened surface 56, both a random, irregular roughness and a regular roughness in the form of, for instance, a regular etching structure being considered.

In the region of the recess 58, light is only coupled out from the thin-film light-emitting diode 10. Owing to the active layer that has been removed, photons are not generated there, however, so that this region forms a coupling-out only region 52 of the light-emitting diode 10.

In the region 50, light is generated by recombination of injected charge carriers. One part of this light is guided into the coupling-out only region 52, a further part is absorbed in the active layer 34 and yet another part is coupled out from the light-emitting diode via the front side 60. Consequently, both light generation and coupling-out of light take place in the region 50. The region 50 and the coupling-out only region 52 together form a light coupling-out region 54, from which light is coupled out from the light-emitting diode. Light is neither generated nor coupled out in the central region of the thin-film stack 30 below the central mid-contact 40.

Figure 5:
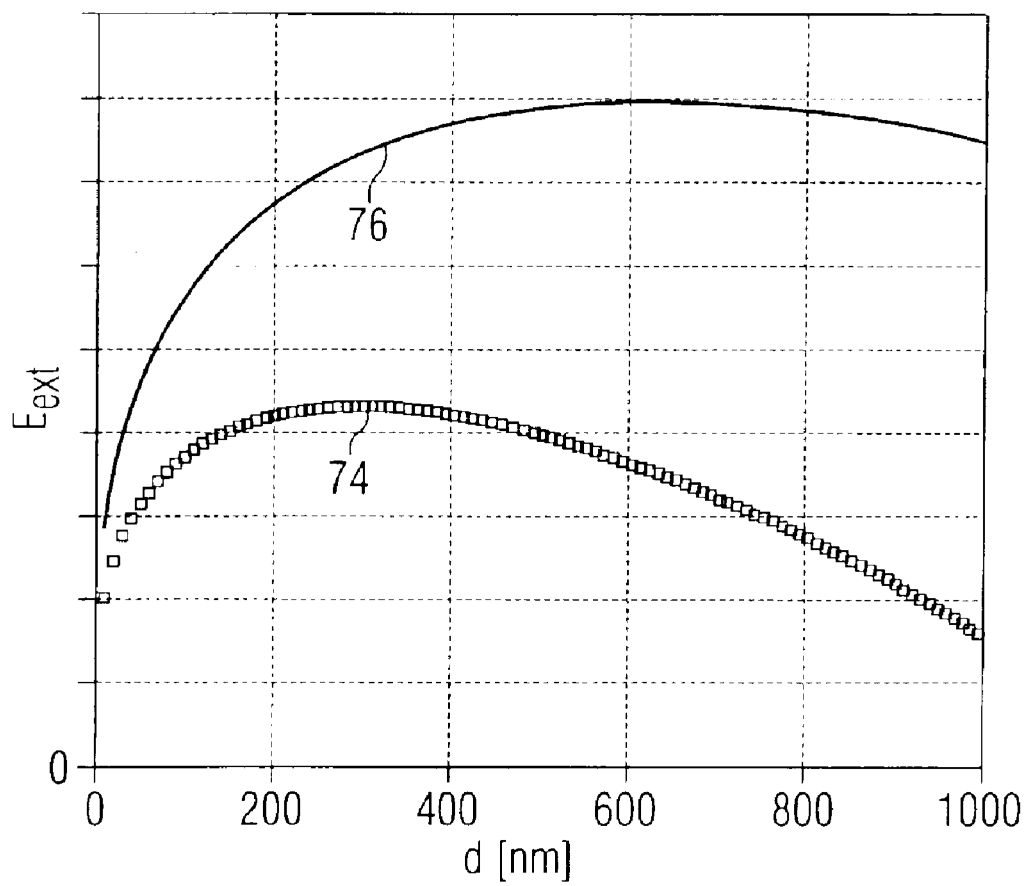
FIG. 5 shows the profile of the external efficiency $E_{ext}$ of a conventional yellow AlGaInP thin-film diode and of a thin-film diode according to the invention as a function of the thickness d of the active layer.

In the case of the remaining layer thickness of the first cladding layer 32 in the coupling-out only region 52 of about 4 μm, about 25% of the total emitted radiation is passed into the virtually absorption-free coupling-out only region 52. Given a coupling-out efficiency of this radiation of 80%, the external efficiency $E_{ext}$ of the light-emitting diode is more than doubled. FIG. 5 shows the dependence of the external efficiency $E_{ext}$ of a light-emitting diode according to the invention on the layer thickness d of the active layer (curve 76). Compared with a comparable conventional thin-film light-emitting diode (curve 74), the maximum of the external efficiency is achieved at larger values for the layer thickness, at a layer thickness of d=625 nm in the exemplary embodiment.

Consequently, given the same total area of the light-emitting diode, it is possible to reduce the higher charge carrier density which results from the reduction of the active area by the recesses 58. Consequently, the internal efficiency of the light-emitting diode is not significantly reduced. This effect is already taken into account in the profile 76 illustrated in FIG. 5.

As can likewise be seen from FIG. 5, the external efficiency is very high in a wide thickness range around the maximum value. Thus, the external efficiency lies above 95% of the maximum achievable value between a layer thickness of 350 nm and 1000 nm.

As an alternative or in addition to the roughness of the surface 56 of the first cladding layer 32, it is also possible to introduce a roughness at the rear side 62 of the layer stack 30 above the p-side mirror layer 46.

Over and above the roughnesses mentioned, it is also possible, in the context of the invention, for the front side 60 or the rear side 62 to be roughened in order to produce internal scattering processes. The sidewalls of the mesa structure produced by the recesses 58 can also be beveled.

The invention is not restricted to the explanation thereof on the basis of the exemplary embodiments. Rather, the invention encompasses every new feature and also the features disclosed in the above description, in the drawing and also in the claims, as well as every combination of these features, even if this combination is not explicitly specified.

What is claimed is:

1. A light-emitting semiconductor component having:

a thin-film stack (30) having an active layer (34); and front- and rear-side contact regions (40, 42), which are formed on a front side (60) and a rear side (62) of the thin-film stack (30) and serve for impressing current into the active layer (34), wherein the thin-film stack (30) has a light generation region (50), in which photons are generated by recombination of charge carriers, and has a light coupling-out region (54), in which light is coupled out from the component, a part of the light coupling-out region (54) being separated separated from the light generation region (50), and the light generation region (50) being spatially separated from the contact regions (40, 42) in the plane of the thin-film stack (30).

2. The light-emitting semiconductor component as claimed in claim 1, wherein the light coupling-out region (54) contains the light generation region (50), light being generated and coupled out from the light generation region (50).

3. The light-emitting semiconductor component as claimed in claim 1, wherein the light coupling-out region (54) contains a coupling-out only region (52) without an active layer, in which no photons are generated by recombination of charge carriers.

4. The light-emitting semiconductor component as claimed in claim 3, wherein the surface (56) of the coupling-out only region (52), which surface faces toward the front side (60) of the thin-film stack (30), is roughened.

5. The light-emitting semiconductor component as claimed in claim 4, wherein the surface (56) of the coupling-out only region (52), which surface faces toward the front side (60) of the thin-film stack (30), has a roughness with an irregular structure.

6. The light-emitting semiconductor component as claimed in claim 4, wherein the surface (56) of the coupling-out only region (52), which surface faces toward the front side (60) of the thin-film stack (30), has a regular etching structure, as roughness.

7. The light-emitting semiconductor component as claimed in claim 3, wherein that surface of the coupling-out only region (52) which faces toward the rear side (62) of the thin-film stack (30) has a roughness with an irregular structure.

8. The light-emitting semiconductor component as claimed in claim 3, wherein that surface of the coupling-out only region (52) which faces toward the rear side (62) of the thin-film stack (30) has a regular etching structure, as roughness.

9. The light-emitting semiconductor component as claimed in claim 1, wherein the light generation region (50) is spatially separated from the contact regions (40, 42) by separating regions (38, 58) without an active layer.

10. The light-emitting semiconductor component as claimed in claim 1, wherein the thin-film stack (30) has a first recess (38), interrupting the active layer (34), in a region around the front-side contact region (40).

11. The light-emitting semiconductor component as claimed in claim 1, wherein the thin-film stack (30) has a second recess (58), interrupting the active layer (34), in a region above the rear-side contact region (42).

12. The light-emitting semiconductor component as claimed in claim 1, wherein the light coupling-out region (54) contains a coupling-out only region (52) without an active layer, in which no photons are generated by recombination of charge carriers and wherein the coupling-out only region (52) encompasses the region of the second recess (58).

13. The light-emitting semiconductor component as claimed in claim 1, wherein the light generation region (50) is electrically connected to the contact regions (40, 42) in each case by means of a cladding layer (32, 36).

14. The light-emitting semiconductor component as claimed in claim 13, wherein the cladding layer (32) connecting the light generation region (50) to the rear-side contact region (42) forms the coupling-out only region (52) in the region of the second recess (58).

15. The light-emitting semiconductor component as claimed in claim 14, wherein the cladding layer (32) connecting the light generation region (50) to the rear-side contact region (42) has a layer thickness between and including 1 μm and 15 μm in the region of the second recess (58).

16. The light-emitting semiconductor component as claimed in claim 14, wherein the cladding layer (32) connecting the light generation region (50) to the rear-side contact region (42) has a layer thickness between and including 2 μm and 8 μm in the region of the second recess (58).

17. The light-emitting semiconductor component as claimed in claim 1, wherein the active layer (32) has a layer thickness between and including 150 nm to 1500 nm.

18. The light-emitting semiconductor component as claimed in claim 1, wherein the active layer (32) has a layer thickness between and including 400 nm to 1000 nm.

19. The light-emitting semiconductor component as claimed in claim 1, wherein the front-side contact region is formed by a central middle contact (40).

20. The light-emitting semiconductor component as claimed in claim 1, wherein the rear-side contact region is formed by a peripheral contact frame (42) at the edge of the component.

21. The light-emitting semiconductor component as claimed in claim 1, wherein the thin-film stack (30) has a thickness of between and including 3 μm and 50 μm.

22. The light-emitting semiconductor component as claimed in claim 1, wherein the thin-film stack (30) has a thickness of between and including 5 μm and 25 μm.

23. The light-emitting semiconductor component as claimed in claim 1, wherein the thin-film stack (30) has a layer sequence based on $Al_xGa_yIn_{1-x-y}P$, where $0 \leqq x \leqq 1$, $0 \leqq y \leqq 1$ and $x+y \leqq 1$.

24. The light-emitting semiconductor component as claimed in claim 1, wherein the cladding layers (32, 36) of the thin-film stack (30) are formed on the basis of $Al_xGa_{1-x}As$, where $0 \leqq x \leqq 1$.

25. The light-emitting semiconductor component as claimed in claim 21, wherein an active layer (34) formed on the basis of $Al_xGa_yIn_{1-x-y}P$, where $0 \leqq x \leqq 1$, $0 \leqq y \leqq 1$ and $x+y \leqq 1$, is arranged between the cladding layers (32, 36).

26. The light-emitting semiconductor component as claimed in claim 1, wherein the thin-film stack (30) has a layer sequence based on $Al_xGa_{1-x}As$, where $0 \leqq x \leqq 1$.

27. The light-emitting semiconductor component as claimed in claim 10, wherein the thin-film stack (30) has a second recess (58), interrupting the active layer (34), in a region above the rear-side contact region (42).

28. A light-emitting semiconductor component, comprising:

a thin-film stack (30) having an active layer (34); and front- and rear-side contact regions (40, 42), which are formed on a front side (60) and a rear side (62) of the thin-film stack (30) for impressing current into the active layer (34), wherein the thin-film stack (30) has a light generation region (50), in which photons are generated by recombination of charge carriers, a light coupling-out region (54), in which light is coupled out from the component, at least a part of the light coupling-out region (54) being separate from the light generation region (50) in the plane of the thin-film stack (30), and a highly reflective mirror layer covering the rear side (62) of the thin-film stack (30) except for the area of said rear-side contact region (42).

29. The light-emitting semiconductor component as claimed in claim 28, wherein the highly reflective mirror layer comprises a dielectric mirror layer.

* * * * *

UNITED STATES PATENT AND TRADEMARK OFFICE

CERTIFICATE OF CORRECTION

PATENT NO. : 6,936,853 B2
APPLICATION NO. : 10/448952
DATED : August 30, 2005
INVENTOR(S) : Ralph Wirth It is certified that error appears in the above-identified patent and that said Letters Patent is hereby corrected as shown below:

Col. 7, line 8, replace the expression "being separated separated" with the following:

-- being separated --

Signed and Sealed this

Thirtieth Day of January, 2007

JON W. DUDAS
*Director of the United States Patent and Trademark Office*